United States Patent
Naylor et al.

[11] Patent Number: 6,150,971
[45] Date of Patent: Nov. 21, 2000

[54] R/2R' LADDER SWITCH CIRCUIT AND METHOD FOR DIGITAL-TO-ANALOG CONVERTER

[75] Inventors: Jimmy R. Naylor; Timothy V. Kalthoff; Mark A. Shill; Jeffrey D. Johnson, all of Tucson, Ariz.

[73] Assignee: Burr-Brown Corporation, Tucson, Ariz.

[21] Appl. No.: 09/337,796

[22] Filed: Jun. 22, 1999

[51] Int. Cl.[7] .................................................. H03M 1/78
[52] U.S. Cl. ........................................ 341/154; 341/144
[58] Field of Search .................................. 341/136, 154, 341/144

[56] References Cited

U.S. PATENT DOCUMENTS

| | | | |
|---|---|---|---|
| 4,553,132 | 11/1985 | Dingwall et al. | 341/154 |
| 4,558,242 | 12/1985 | Tuthill et al. | 307/577 |
| 4,590,456 | 5/1986 | Burton et al. | 340/347 |
| 4,683,458 | 7/1987 | Hallgren | 341/154 |
| 4,800,365 | 1/1989 | White et al. | 341/119 |
| 5,043,731 | 8/1991 | Nishimura | 341/154 |
| 5,075,677 | 12/1991 | Meaney et al. | 341/136 |
| 5,387,912 | 2/1995 | Bowers | 341/118 |
| 5,668,553 | 9/1997 | Ashe | 341/154 |
| 5,684,481 | 11/1997 | Ashe | 341/139 |
| 5,764,174 | 6/1998 | Dempsey et al. | 341/154 |

FOREIGN PATENT DOCUMENTS

| | | |
|---|---|---|
| 58-31617 | 2/1983 | Japan . |
| 2-246624 | 10/1990 | Japan . |

*Primary Examiner*—Brian Young
*Attorney, Agent, or Firm*—Cahill, Sutton & Thomas P.L.C.

[57] ABSTRACT

A digital-to-analog converter includes a resistive divider network including a plurality of series resistors of resistance R and a plurality of shunt resistors of resistance 2R' and a circuit for switching a shunt resistor of the resistive divider network in the digital-to-analog converter to either of first and second reference voltages. The switching circuit includes a first switch MOSFET coupling the low reference voltage to the shunt resistor, and a second switch MOSFET coupling the shunt resistor to the high reference voltage. First and second switch control circuits adjust the on resistances of the first and second switch MOSFETs to be proportional to the resistances of first and second reference resistors, which have the same temperature coefficient as the resistors of which the divider network is composed. The on resistance of each of the first and second switch MOSFETs is equal to $R_{ONi}$, and the resistance 2R' is equal to $2R-R_{ONi}$. The on resistances do not need to be binarily scaled.

28 Claims, 2 Drawing Sheets

R/2R' LADDER SWITCH CIRCUIT AND METHOD FOR DIGITAL-TO-ANALOG CONVERTER

BACKGROUND OF THE INVENTION

The invention relates to bit switch circuitry associated with R/2R ladder voltage divider networks used in digital-to-analog converters (DACs).

The closest prior art is believed to be FIGS. 5 and 9 of U.S. Pat. No. 5,764,174 (Dempsey et a.), in which $V_{gp}$ and $V_{gn}$ of FIG. 9 are provided as controlled "supply" voltages to CMOS buffers 116$i$ and 118$i$ of FIG. 5. U.S. Pat. No. 5,075,677 (Meaney et al.) and U.S. Pat. No. 4,558,242 (Tuthill et al.) also disclose prior art circuits for switching the 2R shunt resistors of R/2R ladders to high and low reference voltages.

The control circuit of FIG. 9 of the Dempsey et al. patent generates two control voltages $V_{gp}$ and $V_{gn}$ which are applied as supply voltages for a pair of CMOS inverters or buffers 46$_i$ and 48$_1$, respectively. The CMOS buffers 46$_i$ and 48$_i$ are controlled by a binary input b$_i$ to turn MOSFETs 42$_i$ and 44$_i$ on and off. The drain electrodes of MOSFETs 42$_i$ and 44$_i$ are connected to a corresponding leg of an R/2R ladder network. MOSFET 42$_i$ can be either P-channel or N-channel (See FIG. 6 of the Dempsey et al. patent), and buffer 46$_i$ is correspondingly inverting or non-inverting.

The operational amplifiers 58 and 59 each operate to balance their (+) and (−) inputs. Resistors 54 and 57 in FIG. 9 of the Dempsey et al. patent establish the same bias currents, in order to match the on resistance of combined MOSFETs 55 to the resistance of combined resistors 52, and match the on resistance of combined MOSFETs 56 to the resistance of combined resistors 53. The circuit structure which produces the common bias currents includes resistors 54 and 57 and prevents accurate operation of the circuit of FIG. 9 of the Dempsey et al. patent if $v_{REF+}$ is not more than approximately 2 volts above $V_{REF-}$. As the difference between $V_{REF+}$ and $V_{REF-}$ decreases, the current through the circuit of FIG. 9 decreases, and the offset errors of the two operational amplifiers become increasingly large proportions of the voltage drops across the resistors. This leads to increasingly large inaccuracies in operation.

FIG. 11 of the Dempsey et al. patent discloses an alternative embodiment in which unit resistors 72 and 74 are connected in series between the drains of the MOSFET switches 42$_i$ and 44$_i$ and the corresponding leg of the R/2R ladder. This embodiment controls the on resistance of the MOSFET switches 42$_i$ and 44$_i$ with respect to the resistances of unit resistors 72 and 74.

The control and switching circuitry of the Dempsey et al. patent and all of the relevant prior art is designed to be used in conjunction with conventional R/2R resistive divider networks in which the series resistors all have the resistance R and the shunt resistors all have the resistance 2R.

For all known R/2R resistive divider networks, it is necessary to binarily scale the channel-width-to-channel-length ratios (W/L ratios) of the switches that selectively couple the 2R shunt resistors to the high reference voltage or the low reference voltage. This is very problematic for digital-to-analog converters having a large number of bits of resolution, e.g., 12 to 16 bits of resolution. For example, in a 16-bit digital-to-analog converter, if the on resistance of the MSB switch is 40 ohms, the on resistance of the LSB switch would be 320 kilohms to 1.20 megohms. Very large MOSFETs are required to provide a 40 ohm on resistance because the channel width W must be very large. Very large MOSFETs are also required to provide an on resistance of 320 kilohms to 1.20 megohms because the channel length L must be very large. Therefore, a large amount of chip area is required for an accurate implementation of a digital-to-analog converter using an R/2R divider network. To avoid the large amount of chip area, those skilled in the art have developed various "short cuts" for avoiding the use of very large MOSFET switches for the LSB bits, but these techniques introduce inaccuracies that may not be acceptable for digital-to-analog converters having more than about 12 bits of resolution.

For example, in some cases those skilled in the art simply do not binarily scale the size of the switches for the least significant bits of the R/2R ladder and merely accept the resulting errors. Another approach has been to insert a high resistance thin-film resistor in series with the switch, and accept the fact that the temperature coefficient of the thin-film resistor is different than that of the on resistance of the switch. Using unit resistors as shown in FIG. 13 of the Dempsey et al. patent is yet another shortcut that has been used to avoid binarily scaling the on resistances of the switches for the least significant legs of an R/2R ladder network.

A difficulty in scaling MOSFET switches to have large on resistances by making the channel length L very long is that the magnitude of the effective gate-to-source voltage which produces the on resistance $R_{ON}$ is progressively reduced along the length of the channel region due to a voltage drop developed along the channel region due to current flowing through it. Consequently, binarily scaling the W/L ratio does not result in binarily scaling $R_{ON}$ for all values of channel current. This causes code-dependent errors, especially in the least significant bit switches, because the channel currents are very code-dependent in MOSFET switches connected to an R/2R ladder. This is a major problem in obtaining high resolution digital-to-analog converters of high accuracy.

It would be very desirable to provide a digital-to-analog converter (1) which is more accurate than those of the prior art, and (2) in which the difference between the externally supplied upper and lower reference voltages can be small.

SUMMARY OF THE INVENTION

Accordingly, it is an object of the invention to provide a circuit and technique which avoid the need to binarily scale the on resistances of the various bit switch transistors that couple shunt resistors of a resistive divider network to either a high reference voltage or a low reference voltage.

It is another object of the invention to provide a digital-to-analog converter that is more accurate and less expensive than the closest prior art.

It is another object of the invention to provide a bridge control circuit for controlling the bit switches that operate to couple a shunt resistor of a resistive divider network to either a high reference voltage or a low reference voltage wherein the bridge control circuit avoids inaccuracies due to variations in user-supplied reference voltages.

It is another object of the invention to provide a digital-to-analog converter in which the difference between user-supplied reference voltages can be substantially less than that for the closest prior art.

It is another object of the invention to avoid code-dependent inaccuracies that occur in prior high resolution digital-to-analog converters having R/2R ladders.

It is another object of the invention to avoid use of series-connected bit switch MOSFETs to achieve an effective long channel length (L) in a digital-to-analog converter with a resistive ladder network, and to reduce the amount of chip area required for bit switch MOSFETs.

It is another object of the invention to avoid use of scaled bit switches connected in series with "unit" resistors as in FIGS. 11 and 13 of U.S. Pat. No. 5,764,174 to achieve the required binary scaled switch on resistances.

Briefly described, and in accordance with one embodiment thereof, the invention provides a digital-to-analog converter (1) including a resistive divider network (10) including a plurality of series resistors (27$i$) each having a resistance R and a plurality of shunt resistors (30$i$) each having a resistance 2R', and a circuit for switching a shunt resistor (30$i$) of the resistive divider network (10) in the digital-to-analog converter (1) to either of first and second reference voltages. The digital-to-analog converter includes a first switch MOSFET (44$i$) coupling the low reference voltage (VREFL) to the shunt resistor (30$i$), and a second switch MOSFET (42$i$) coupling the shunt resistor (30$i$) to the high reference voltage (VREPH). A first switch control circuit (11) includes a first CMOS inverter (39), having an output coupled to a gate of the first switch MOSFET (44$i$), and a first bridge circuit (11A) including a first reference resistor (26) and a first control MOSFET (24) both coupled to the low reference voltage (VREFL), and a first operational amplifier (37) having an output connected to a gate of the first control MOSFET (24) and coupled to a gate of the first switch MOSFET (44$i$) and operative to equalize the resistances of the first control MOSFET (24) and the first reference resistor (26) and adjust the on resistance of the first switch MOSFET (44$i$) to be proportional to the resistance of the first reference resistor (26). A second switch control circuit (12) includes a second CMOS inverter (21), having an output coupled to a gate of the second switch MOSFET (42$i$), and a second bridge circuit (12A) including a second reference resistor (25) and a second control MOSFET (23), and a second operational amplifier (43) having an output connected to a gate of the second control MOSFET (23) and coupled to a gate of the second switch MOSFET (42$i$) and operative to equalize the resistances of the second control MOSFET (23) and the second reference resistor (25) and adjust the on resistance of the second switch MOSFET (42$i$) to be proportional to the resistance of the second reference resistor (25). The on resistance of each of the first (44$i$) and second (42$i$) switch MOSFETs is equal to $R_{ONi}$, and the resistance 2R' is equal to 2R–$R_{ONi}$.

In one embodiment, the invention provides a technique for achieving a high degree of accuracy in a digital-to-analog converter without binary scaling of bit switches to connect shunt resistors of a resistive ladder network to either a low reference voltage ($V_{REFL}$) or a high reference voltage ($V_{REFH}$). For each shunt resistor, a first switch MOSFET (44$_i$) is coupled between a terminal of the shunt resistor and the low reference voltage ($V_{REFL}$), and a second switch MOSFET (42$_i$) is coupled between the terminal of the shunt resistor and the high reference voltage ($V_{REFH}$). Control voltages are applied to the gate electrodes of the first (44$_i$) and second (42$_i$) switch MOSFETs according to states of bits of a digital input word applied to the digital-to-analog converter to turn on one or the other of the first (44$i$) and second (42$i$) switch MOSFETs coupled to the terminal of each shunt resistor, respectively, so as to cause an on resistance of each turned on first or second switch MOSFET to be equal to 2R–2R', where R is the resistance of each of a plurality of series resistors of the resistive ladder network and 2R' is the resistance of the shunt resistor to which the turned on first or second switch is coupled. The magnitudes of the control voltages are controlled such that the temperature coefficient of the on resistances of the turned on first and second switch MOSFETs is equal to a temperature coefficient of resistors of which the resistive ladder network is composed. The on resistance of the first switch MOSFETs (44$i$) and the second switch MOSFETs (42$_i$) are not binarily scaled.

DETAILED DESCRIPTION OF THE PREFERRED EMBODIMENTS

Figure 1:
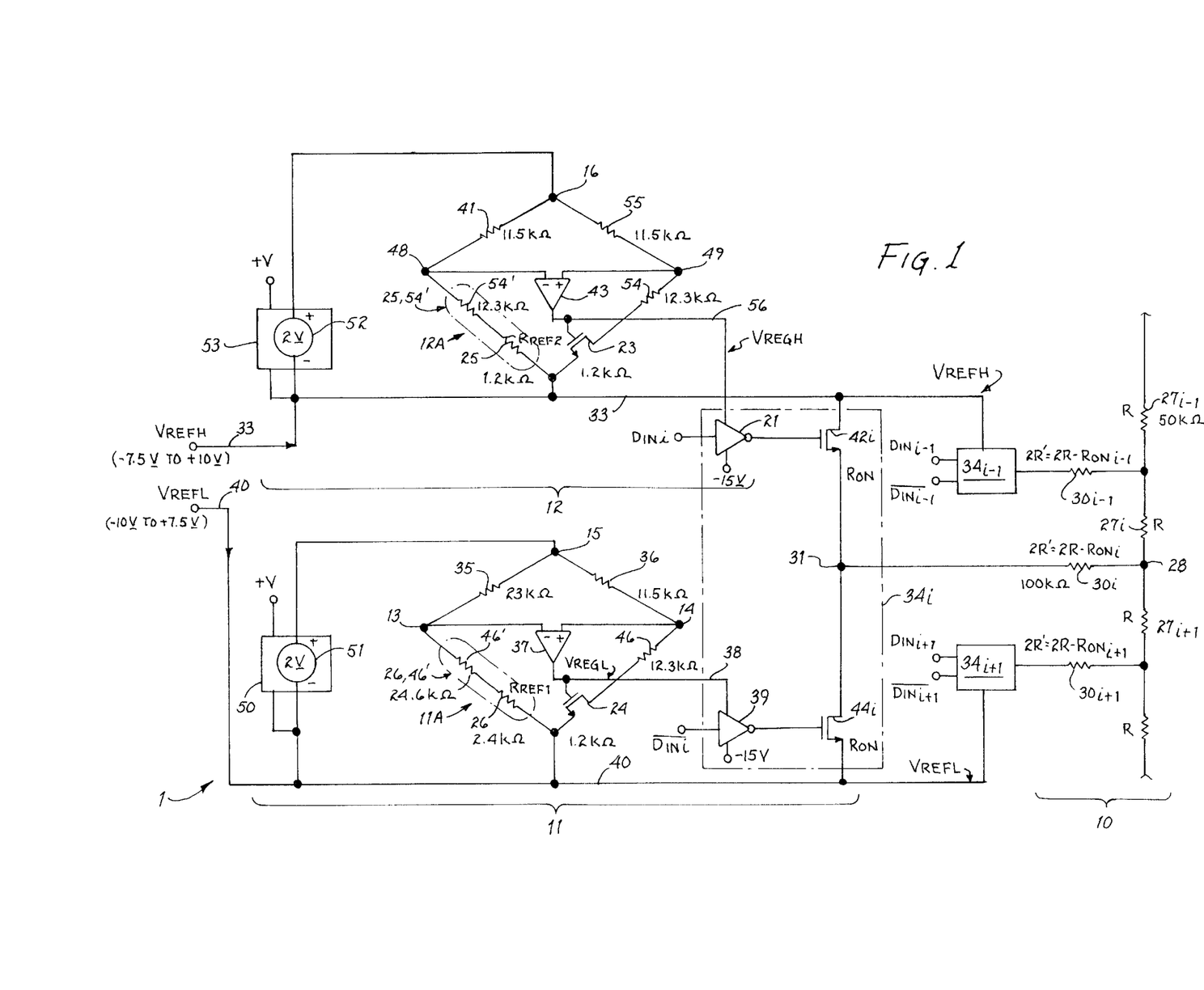
FIG. 1 is a schematic diagram of a digital-to-analog converter including the bit switch control circuitry and R/2R' resistive divider network of the present invention.
Figure 2:
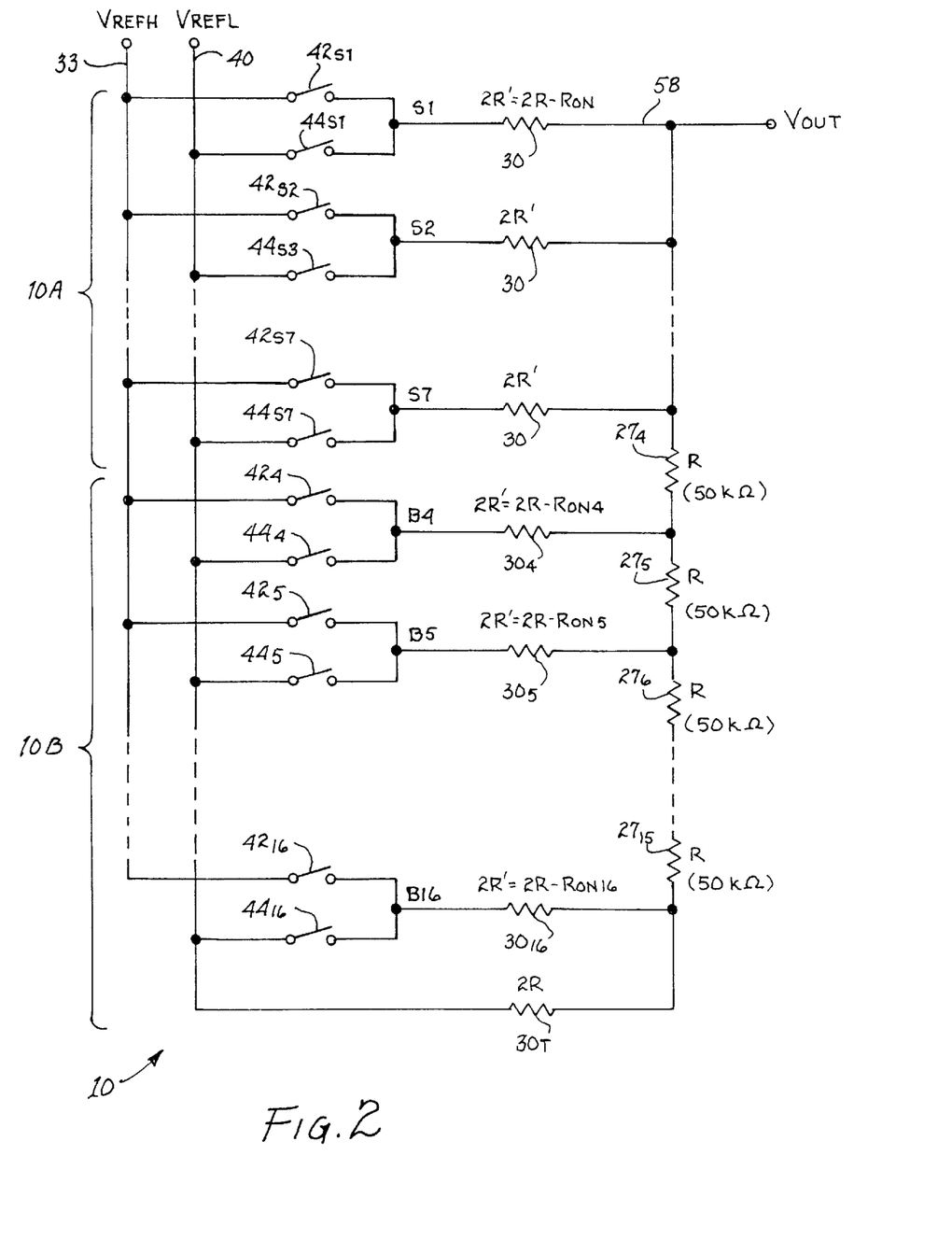
FIG. 2 is a more detailed schematic diagram of the R/2R' resistive divider network 10 included in FIG. 1.

Referring to FIGS. 1 and 2, a 16-bit digital-to-analog converter 1 includes a resistive divider network 10 having a plurality of series resistors 27$_i$ of resistance R and a plurality of shunt resistors 30$_i$ each having a resistance 2R', 20 switch and driver circuits 34$_i$, and first and second bridge control circuits 11 and 12, wherein i has values from 1 to 20. (Note that the value of 2R' for any shunt leg of divider network 10 depends on the $R_{ON}$ of the corresponding switches, as subsequently explained.) Lower bridge control circuit 11 applies an externally supplied reference voltage $V_{REFL}$ to each of 16 N-channel $V_{REFL}$ switch MOSFETs 44$_i$, and upper bridge control circuit 12 applies an externally supplied reference voltage $V_{REFH}$ to each of i N-channel "$V_{REFH}$ switch" MOSFETs 42$_i$. Except for the first three most significant bits, switch MOSFETs 42$_i$ and 44$_i$ in each switch and driver circuit 34$_i$ are turned on and off in response to the corresponding ith bit DIN$_i$ of a 16-bit digital input word. (The first three bits 1–3 of the digital input code are "segmented" or decoded in a thermometer type decoder with three inputs and seven outputs going to each of the first seven segments of the resistive network ladder circuit, as described subsequently with reference to FIG. 2. This produces outputs for all eight combinations of the first three most significant bits of the digital input word, each separated from another by one-eighth of the voltage range determined by the difference between $V_{REFL}$ and $V_{REFH}$.)

Specifically, the drain of switch MOSFET 42$_i$ is connected to a conductor 33 on which the voltage $V_{REFH}$ (typically +10 volts, but it could be as low as about –9.9 volts when $V_{REFL}$ is –10 volts) is maintained. The source of switch MOSFET 42$_i$ is connected by conductor 31 to shunt resistor 30$_i$ of a "modified R/2R ladder network" 10. Switch MOSFET 44$_i$ has its drain connected by conductor 31 to shunt resistor 30$_i$ and its source connected to conductor 40, on which $V_{REFL}$ is provided by the user of digital-to-analog converter 1. $V_{REFL}$ has a value of typically –10 volts, but it could be as high as +9.9 volts when $V_{REFH}$ is +10 volts. The circuit of FIG. 1 provides very accurate values of $R_{ON}$ of switch MOSFETs 42$_i$ and 44$_i$ despite changes in $V_{REFH}$ and $V_{REFL}$, even when the two are very close (e.g., within 100 millivolts) in value.

R/2R' ladder network 10 differs from a conventional R/2R ladder network (e.g., as shown in FIG. 13 of the Dempsey et al. patent) because the resistance of shunt resistor 30$_i$ is not 2R as in a conventional R/2R ladder, but instead is equal to 2R', where 2R' is equal to 2R–$R_{ONi}$, $R_{ONi}$ being the channel resistance of the one of switch MOSFETs 42$_i$ and 44$_i$ that is presently on. Stated differently, the total resistance "2R" of each shunt resistance of the resistive divider network of the present invention includes the on resistance $R_{ONi}$ of the corresponding bit switch $42_i$ or $44_i$, unlike the prior art digital-to-analog converters in which each shunt leg of the resistive network 10 has a value of precisely 2R.

Unlike the prior art, the W/L ratios (i.e., the channel-width-to-channel-length ratios) of the switch MOSFETs $44_i$ and $42_i$ of the various bits are not adjusted to provide binarily scaled on resistances. Instead, they are selected to be of suitable small sizes and to have suitable on resistances. The value of the various 2R' resistances of R/2R' ladder network 10 can be different for the various bits; this feature is different from a conventional R/2R ladder network wherein the 2R resistances of all shunt resistors of the resistive divider network necessarily are precisely equal to a value of 2R.

The on resistances of switch MOSFETs $42_i$ and $44_i$ are controlled by bridge control circuits 11 and 12 to have the same temperature coefficients as the resistances R and 2R' of the series and shunt resistors of resistive divider network 10. It is this property that allows the on resistances of non-binarily-scaled switch MOSFETs $42_i$ and $44_i$ to be included in the total resistance $2R=2R'+R_{ONi}$ of the shunt resistor leg of resistive divider network 10.

All of the resistors in bridge control circuits 11 and 12 and R/2R' divider network 10 are thin film resistors formed of chromium silicide or silicon chrome material, referred to as sichrome, so the temperature coefficient of the on resistance of MOSFET 24 tracks with the temperature coefficient of the resistance of reference resistor 26 and the on resistance of MOSFET 23 tracks with the resistance of a second reference resistor 25. Consequently, the temperature coefficients of the on resistances of switch MOSFETs $44_i$ also track with the temperature coefficient of the resistance of sichrome resistor 26 and the sichrome resistors R and 2R' of divider network 10.

Lower bridge control circuit 11 includes a bridge circuit 11A including a first reference resistor 26 of resistance $R_{REF1}$ having its lower terminal coupled to conductor 40 and its upper terminal coupled to one terminal of a resistor 46'. The other terminal of resistor 46' is connected by a conductor 13 to the (−) input of an operational amplifier 37 and to the lower terminal of a resistor 35. The upper terminal of resistor 35 is connected by conductor 15 to the (+) terminal of a constant voltage source circuit 51 having a value of approximately 2 volts and to the upper terminal of a resistor 36. The voltage on conductor 15 is "bootstrapped" up to a level 2 volts above $V_{REFL}$, since the (−) terminal of constant voltage source 51 is connected to $V_{REFL}$ conductor 40. Constant voltage circuit 51 is included in a constant voltage source 50 that typically is connected between a +15 volt power supply +V and $V_{REFL}$. The lower terminal of resistor 36 is connected by conductor 14 to the (+) input of operational amplifier 37 and is coupled by a resistor 46 to the drain of an N-channel reference transistor 24 having its gate connected to the output of operational amplifier 37 by conductor 38. The source of N-channel reference MOSFET 24 is connected to conductor 40 on which the external reference voltage $V_{REFL}$ is provided.

A voltage $V_{REGL}$ is produced by operational amplifier 37 on conductor 38, wherein operational amplifier 37 operates as a servo amplifier to establish the gate voltage of control MOSFET 24 as needed to cause its on resistance to be equal to $R_{REF1}$, and to provide the same gate voltage to switch MOSFET $44_i$ so its on resistance $R_{ONi}$ is equal to or scaled with respect to $R_{REF1}$, according to the W/L ratio thereof. $V_{REGL}$ is connected to the high supply terminal of a CMOS inverter 39, the low supply voltage terminal of which is connected to a negative supply voltage (which typically is −15 volts). Consequently, the high output voltage of CMOS inverter 39 will be equal to $V_{REGL}$. The output of CMOS inverter 39 is connected to the gate of switch MOSFET $44_i$. Resistors 46 and 46' perform the function of providing more "head room" for operational amplifier 37. That is, the currents flowing through resistors 46 and 46' develop equal voltage drops across them that shift the voltages on conductors 13 and 14 to higher levels relative to the voltage on conductor 40. This provides more "operating room" or "head room" for the input stage of operational amplifier 37.

Resistor 46' actually is integral with reference resistor 26 in a single 27.0 kilohm resistor 26,46'; resistor 46' is illustrated as a separate resistor to aid in explanation of the invention.

Similarly, upper bridge control circuit 12 includes a bridge circuit 12A with a similar second reference resistor 25 of resistance $R_{REF2}$. Reference resistor 25 has its lower terminal connected to conductor 33, on which a second external reference voltage $V_{REFH}$ of typically +10 volts is provided by the user of digital-to-analog converter 1. The upper terminal of reference resistor 25 is coupled by a resistor 54' to the (−) input of operational amplifier 43 and to the lower terminal of a resistor 41. The upper terminal of resistor 41 is connected to the upper terminal of a resistor 55 and to the (+) terminal of a constant voltage supply circuit 52 bootstrapped to a value 2 volts higher than $V_{REFH}$. This produces a voltage of approximately 2 volts across the upper bridge circuit 12A. The (−) terminal of constant voltage source circuit 52 is connected to conductor 33. The lower terminal of resistor 55 is connected by conductor 49 to the (+) input of operational amplifier 43 and is coupled by a resistor 54 to the drain of a second reference N-channel MOSFET 23, the gate of which is connected by conductor 56 to the output of operational amplifier 43. (The bootstrapped voltage sources 51 and 52 each include a conventional constant current source connected to supply a constant current through resistive elements and/or diode elements across which the 2 volt voltage drops are developed.)

Operational amplifier 43 produces a reference voltage $V_{REGH}$ on conductor 56, wherein operational amplifier 43 operates as a servo amplifier to establish the gate voltage of control MOSFET 23 as needed to cause its on resistance to be equal to $R_{REF2}$, and to provide the same gate voltage to switch MOSFET $42_i$ so its on resistance $R_{ONi}$ is equal to or scaled with respect to $R_{REF2}$, according to the W/L ratio thereof. $V_{REGH}$ is connected to the high supply voltage terminal of a CMOS inverter 21. Consequently, the high output voltage of CMOS inverter 21 will be equal to $V_{REGH}$. The low supply voltage terminal of CMOS inverter 45 is connected to −15 volts. The source of reference MOSFET 23 is connected to conductor 33. Resistors 54 and 54' perform the function of providing more head room for operational amplifier 43. That is, the currents flowing through resistors 54' and 46' develop voltage drops across them that shift the voltages on conductors 48 and 49 to higher levels relative to the voltage on conductor 33. This provides more "operating room" or "head room" for the input stage of operational amplifier 43. Note that resistor 54' actually is integral with reference resistor 25 in a single 13.5 kilohm resistor 25,54'; again, resistor 54' is shown as a separate resistor to aid in explanation of the invention.

In accordance with the present invention, the resistance $R_{REF1}$ of reference resistor 26 of lower bridge circuit 11A is scaled relative to reference resistor 25 in bridge circuit 12A in order to reduce power dissipation in lower bridge circuit 11A. For example, $R_{REF1}$ can be 2.4 kilohms, which can be twice the 1.2 kilohm resistance $R_{REF2}$ of reference resistor 25 in upper bridge circuit 12A. In this example, the nominal values of resistors 35 and 36 of lower bridge control circuit 11 are 23 kilohms and 11.5 kilohms, respectively, and the resistances of resistors 41 and 55 of upper bridge control circuit 12 are both 11.5 kilohms.

Thus, in lower bridge control circuit 11, the ratio of resistances of resistors 46' and 46 is equal to 2, and the ratio of resistances of resistors 35 and 36 also is equal to 2. Resistor 35, resistor 46', and reference resistor 26 of bridge 11A form a voltage divider that applies a voltage via conductor 13 to the (−) input of operational amplifier 37. Resistor 36, resistor 46, and reference MOSFET 24 form a voltage divider that applies a voltage via conductor 14 to the (+) input of operational amplifier 37. Operational amplifier 37 applies a voltage via conductor 38 to adjust the channel resistance $R_{ON}$ of MOSFET 24 so that the voltage on conductor 14 equals the voltage on conductor 13. This equality of voltages on conductors 13 and 14 occurs when the ratio of $R_{REF1}$ (2.4 kilohms) to the RON resistance of MOSFET 24 is adjusted to also equal 2, i.e., when $R_{ON}$ (24) equals 1.2 kilohms. The same voltage $V_{REGL}$ needed to cause $R_{ON}$ of MOSFET 24 to be 1.2 kilohms also is applied by conductor 38 and CMOS inverter 39 to the gate of MOSFET $44_i$, causing the channel resistance of MOSFET $44_i$ to be equal to $R_{REF1}$ (or to be suitably scaled with respect to $R_{REF1}$).

In upper bridge control circuit 12, the resistances of resistors 54 and 54' are equal, not scaled, and the resistances of resistors 41 and 55 also are equal. Resistor 41, resistor 54', and reference resistor 25 of bridge control circuit 12A form a voltage divider that applies a voltage via conductor 48 to the (+) input of operational amplifier 43. Resistor 55, resistor 54, and reference MOSFET 23 form a voltage divider that applies a voltage via conductor 49 to the (−) input of operational amplifier 43.

Operational amplifier 43 applies a voltage via conductor 56 to adjust the channel resistance $R_{ON}$ of reference MOSFET 23 so that the voltage on conductor 49 equals the voltage on conductor 48. This occurs when the $R_{ON}$ resistance of MOSFET 23 equals $R_{REF2}$. The same voltage $V_{REGH}$ needed to cause the $R_{ON}$ resistance of MOSFET 23 to be equal to $R_{REF2}$ also is applied by conductor 56 and CMOS inverter 21 to the gate of MOSFET $42_i$, causing the channel resistance of MOSFET $42_i$ to be equal to $R_{REF2}$ or to be suitably scaled with respect to $R_{REF2}$.

Thus, the on resistances of switch MOSFETs $44_i$ and 42 are equal to (or scaled to) different resistance values.

It should be understood that the various node voltages of the bridge circuits 11A and 12A in FIG. 1 are determined by resistive voltage division, so any of the resistors can be regarded as a "reference resistor" with respect to which the on resistances of the corresponding MOSFETs $44_i$ and $42_i$ are controlled. The same is true of the various node voltages and branch currents in bridge circuits 11A and 12A. Therefore, any of the node voltages or any of the branch currents in bridge circuits 11A and 12A can be considered to be a "reference value" with respect to which the on resistances of corresponding switch MOSFETs $44_i$ or $42_i$ are controlled.

The above described ratioing of the corresponding resistances in the left side and right side of bridge circuit 11A of lower bridge control circuit 11 decreases the bias current therein. This substantially reduces the otherwise higher power dissipation in lower bridge control circuit 11. The power dissipation in lower bridge control circuit 11 is equal to the bias current therein multiplied by the large voltage difference between the +15 volt supply voltage applied to constant voltage source circuit 50 and $V_{REFL}$, which is typically −10 volts.

Furthermore, the above described structure in which separate and independent bias circuits are used for lower bridge control circuit 11 and upper bridge control circuit 12 also allow $V_{REFH}$ and $V_{REFL}$ to be within as little as a tenth of a volt of each other, which is much lower than the approximately 2.0 volts mentioned above for the circuit of FIG. 9 of the above mentioned Dempsey et al. patent.

An important consequence of the use of the foregoing R/2R' ladder network (rather than an R/R2 ladder network) in digital-to-analog converter 1 is that the $R_{ONi}$ switch resistances have precisely the same temperature coefficients as the 2R' resistances of the R/2R' ladder network. This is because the reference resistors 26,46' and 25,54' must be composed of the same material (e.g., sichrome) of which the ladder network resistors are composed. Note that this is not the case for the prior art R/2R ladder network and MOSFET switch control circuits, including those disclosed in the above mentioned Dempsey et al. patent.

The above structure differs from what is disclosed in combined FIGS. 7 and 9 of the Dempsey et al. patent by providing completely separate, independent upper and lower bridge circuits. That is, in FIG. 1 the upper bridge circuit 12 is disconnected from and independent of lower bridge circuit 11, in contrast to FIG. 9 of the Dempsey et al. circuit in which the upper bridge circuit including resistors 52 and transistors 55 shares common current source resistors 54 and 57 with lower bridge circuitry including resistors 53 and transistors 56.

Also, in FIG. 1 transistors 23 and 24 are controlled by operational amplifiers 43 and 37, respectively, to precisely match $R_{REF2}$ and $R_{REF1}$, respectively, which are "hidden" portions of a larger resistors that include resistors 54' and 46', respectively. In contrast, in FIG. 9 of the Dempsey et al. patent operational amplifier 58 operates to precisely match the composite resistance of transistors 55 with the composite resistance 52. In lower bridge circuit 11 of FIG. 1, the resistances of the left hand legs 35 and 46',26 are scaled relative to the resistances of the right hand legs 36,24 in order to reduce current and hence power dissipation. Furthermore, the circuit of FIG. 1 operates only with an R/2R' type of ladder network in which 2R' is equal to 2R−$R_{ON}$, $R_{ON}$ being the on resistance of the switch transistors $42_i$ and $44_i$, whereas in the Dempsey et al. patent the circuit only provides accurate conversion for a conventional R/2R ladder network.

For completeness, FIG. 1 shows two additional switch and driver circuits $34_{i-1}$ and $34_{i+1}$ on either side of the above described switch and driver circuit $34_i$. The remainder of divider network 10 is shown in FIG. 2.

Referring to FIG. 2, resistive divider network 10 includes a first section 10A having seven equal segments S1,2 ... 7 in which the most significant three bits of the digital input word constitute a thermometer code that is decoded to provide eight equal voltage segments for implementation of the three most significant bits (bits 1–3) of digital-to-analog converter 1. The conductor 58 connected to the right end of each of the 2R' shunt resistors 30 of seven-segment section 10A conducts the output voltage $V_{OUT}$ of digital-to-analog converter 1. Each shunt leg in FIG. 2 can have a resistance of 100 kilohms, including the resistance 2R' and the $R_{ON}$ of the associated switches. Resistive divider 10 also includes a second section 10B including an R/2R' ladder network for bits 4–16, wherein each series resistor $27_{4,5\ldots15}$ has a value R. Each shunt resistor $30_{4,5\ldots6}$ has a value 2R' equal to $2R-R_{ONi}$, where $R_{ONi}$ is the on resistance of the corresponding switches $42_i$ and $44_i$. The seven segment resistors 2R' of sections S1–S7 are equal (for example) to 100 kilohms which include the on resistances of MOSFET switches $42_{S1\text{-}7}$ and $44_{S1\text{-}7}$, which can be 75 ohms. The resistances of the on resistances switches for bit B4 can be 150 ohms. The on resistances for the switches for bits B5–9 can be 300 ohms. The on resistances for bits B10–16 can be 600 ohms. Note that these on resistances are arbitrary. The low values of the on resistances allow use of MOSFET switches all with the same short channel length, with relatively little of the previously described code-dependent variation in $R_{ON}$.

A main advantage of digital-to-analog converter 1 as described above is that the on resistances of the switch MOSFETs $42_i$ and $44_i$ do not have to be binarily scaled, and therefore can be much smaller in size than the MSB switch MOSFETs and LSB switch MOSFETs of the prior art. This advantage is due to the described circuit in which the on resistance of control MOSFETs 23 and 24 tracks with reference resistors composed of the same material as the resistors of divider network 10. 16-bit and higher resolution and corresponding accuracy can be achieved without resort to any of the above mentioned "short cut" techniques which have been used previously to avoid use of very large switch transistors that would be required for accurate implementation of the least significant bits of the digital-to-analog converter.

Furthermore, the independence of the bridge control circuits 11 and 12 allows ratioing of their bias currents so that the current through lower bridge control circuit 11 is substantially less than that through upper bridge control circuit 12.

The greatly reduced size of the switch MOSFETs $42_i$ and $44_i$ for the most significant and least significant groups of bits of digital-to-analog converter 1 also results in reduced chip size and reduced cost. The independence of upper and lower bridge control circuits 11 and 12 allows the difference between the externally supplied reference voltages to be small.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, if resistors 35, 36, 41 and 55 in FIG. 1 are replaced by suitable constant current sources, then the bootstrap voltage source circuits 50 and 53 can be omitted. The upper switches $42_i$ could be P-channel MOSFETs, in which case the buffer 21 would be non-inverting buffers. The buffer circuitry including inverters $42_i$ and $44_i$ could be configured so that logical complement signals are not required. As another example, bridge circuit 12A in FIG. 1 could be replaced by a bridge circuit which is the mirror image of bridge circuit 12A and is shown below conductor 33, with the polarity of voltage source 52 reversed and N-channel MOSFET 23 replaced by an equivalent P-channel MOSFET. Or, an N-channel MOSFET 23 could be used, with its source and drain electrodes reversed and with the (+) and (−) inputs of operational amplifier 43 also reversed. Similarly, lower bridge circuit 11A could be replaced by a mirror image thereof.

What is claimed is:

1. A circuit for switching a shunt resistor of a resistive divider network in a digital-to-analog converter to either of a low reference voltage and a high reference voltage, comprising:
   (a) a first switch MOSFET coupling the low reference voltage to the shunt resistor, and a second switch MOSFET coupling the shunt resistor to the high reference voltage;
   (b) a first switch control circuit including
      i a first CMOS logic circuit, having an output coupled to a gate of the first switch MOSFET, and
      ii a first bridge circuit including a first reference resistor and a first control MOSFET both coupled to the low reference voltage, and a first operational amplifier having an output connected to a gate of the first control MOSFET and also coupled by the first CMOS logic circuit to a gate of the first switch MOSFET and operative to equalize the resistances of the first control MOSFET and the first reference resistor so as to adjust the on resistance of the first switch MOSFET to a value proportional to the resistance of the first reference resistor;
   (c) a second switch control circuit including
      i. a second CMOS logic circuit, having an output coupled to a gate of the second switch MOSFET, and
      ii. a second bridge circuit including a second reference resistor and a second control MOSFET, and a second operational amplifier having an output connected to a gate of the second control MOSFET and also coupled by the second CMOS logic circuit to a gate of the second switch MOSFET and operative to equalize the resistances of the second control MOSFET and the second reference resistor and adjust the on resistance of the second switch MOSFET to a value proportional to the resistance of the second reference resistor.

2. The circuit of claim 1 wherein the resistance of the first reference resistor is substantially different from the resistance of the second reference resistor.

3. The circuit of claim 1 wherein the first and second CMOS logic circuits are CMOS inverters.

4. The circuit of claim 1 wherein the first bridge circuit includes a first bridge input conductor coupled to energize the first bridge circuit, and the second bridge circuit includes a second bridge input conductor coupled to energize the second bridge circuit.

5. The circuit of claim 4 wherein the first bridge input conductor is coupled to the first reference resistor and a (−) input of the first operational amplifier by a first current source element, and is also coupled to the first control MOSFET and a (+) input of the first operational amplifier by a second current source element, and wherein the second bridge input conductor is coupled to the second reference resistor and a (−) input of the second operational amplifier by a third current source element and is also coupled to the second control MOSFET and a (+) input of the second operational amplifier by a fourth current source element.

6. The circuit of claim 1 including a first current source element coupled to the first reference resistor and a (−) input of the first operational amplifier, a second current source element coupled to the first control MOSFET and a (+) input of the first operational amplifier, a third current source element coupled to the second reference resistor and a (−) input of the second operational amplifier, and a fourth current source element coupled to the second control MOSFET and a (+) input of the second operational amplifier.

7. The circuit of claim 5 wherein the first, second, third and fourth current source elements are first, second, third, and fourth resistors, respectively, and wherein the first bridge input conductor conducts a voltage which is bootstrapped a constant amount from the low reference voltage, and the second bridge input conductor conducts a voltage which is bootstrapped another constant amount from the high reference voltage.

8. The circuit of claim 5 wherein the (+)input of the first operational amplifier is coupled to a drain of the first control MOSFET by a first level shift resistor, and the first reference resistor is an integral part of a first composite resistor that also includes a first level shift resistance equal to the resistance of the first level shift resistor in series with the resistance of the first reference resistor, and wherein the (+) input of the second operational amplifier is coupled to a drain of the second control MOSFET by a second level shift resistor, and the second reference resistor is an integral part of a second composite resistor that also includes a second level shift resistance in series with the resistance of the second level shift resistor.

9. The circuit of claim 5 wherein the resistance of the first reference resistor is a substantially larger value than the resistance of the second reference resistor, to substantially reduce a bias current flowing through the first bridge circuit relative to a corresponding bias current flowing through the second bridge circuit.

10. The circuit of claim 1 including first means in the first bridge control circuit for maintaining a first bias current energizing the first bridge circuit at a value independent of the low reference voltage and second means in the second bridge control circuit for maintaining a second bias current energizing the second bridge circuit at a value independent of the high reference voltage.

11. A circuit for switching a leg of an R/2R' resistive divider network in a digital-to-analog converter to a high reference voltage or a low reference voltage in response to logic information corresponding to a bit of a binary input applied to a digital input of the digital-to-analog converter, comprising:

(a) a switch circuit including a first MOSFET having a source coupled to a first conductor conducting the low reference voltage and a drain coupled to a conductor of the leg, and a second MOSFET having a source coupled to the conductor of the leg and a drain coupled to a second reference voltage conductor conducting the high reference voltage;

(b) a first switch control circuit including
  i. a first CMOS inverter coupled between a first power conductor and a second power conductor, and having an input connected to receive the logic information, and an output coupled to the gate of the first MOSFET,
  ii. a first bootstrapped reference voltage source,
  iii. a first bridge circuit including first and second input terminals and first and second output terminals, the first bootstrapped reference voltage source being coupled between the first and second input terminals,
  iv. a first resistor coupled between the second input terminal and the first output terminal, a second resistor coupled between the first output terminal and the first input terminal, a third resistor coupled between the first input terminal and the second output terminal, a fourth resistor coupled between the second output terminal and the second input terminal, and a third MOSFET coupling the fourth resistor to the second input terminal, and
  v. a first operational amplifier having a first input coupled to the first output terminal, a second input coupled to the second output terminal, and an output connected by a second conductor to a gate electrode of the third MOSFET; and (c) a second switch control circuit including
  i. a second CMOS inverter coupled between a third power conductor and the second power conductor, and having an input connected to receive a complement of the binary bit signal, and an output coupled to the gate of the second MOSFET,
  ii. a second bootstrapped reference voltage source,
  iii. a second bridge circuit including third and fourth input terminals and third and fourth output terminals, the second bootstrapped reference voltage source being coupled between the third and fourth input terminals,
  iv. a fifth resistor coupled between the fourth input terminal and the third output terminal, a sixth resistor coupled between the third output terminal and the third input terminal, a seventh resistor coupled between the third input terminal and the fourth output terminal, an eighth resistor coupled between the fourth output terminal and the fourth input terminal, and a fourth MOSFET coupling the eighth resistor to the fourth input terminal, and
  v. a second operational amplifier having a first input coupled to the third output terminal, a second input coupled to the fourth output terminal, and an output connected by a third conductor to a gate electrode of the fourth MOSFET, wherein the on resistance of each of the first and second switch MOSFETs is equal to $R_{ONi}$, and the resistance 2R' is equal to $2R-R_{ONi}$.

12. A digital-to-analog converter comprising:
(a) a resistive divider network including a plurality of series resistors each having a resistance R and a plurality of shunt resistors each having a resistance 2R';
(b) a circuit for switching a shunt resistor of a resistive divider network in a digital-to-analog converter to either of a low reference voltage and a high reference voltage, including
  (1) a first switch MOSFET coupling the low reference voltage to the shunt resistor, and a second switch MOSFET
    i coupling the shunt resistor to the high reference voltage,
  (2) a first switch control circuit including
    i. a first CMOS logic circuit, having an output coupled to a gate of the first switch MOSFET, and
    ii. a first bridge circuit including a first reference resistor and a first control MOSFET both coupled to the low reference voltage, and a first operational amplifier having an output connected to a gate of the first control MOSFET and also coupled by the first CMOS logic circuit to a gate of the first switch MOSFET and operative to equalize the resistances of the first control MOSFET and the first reference resistor so as to adjust the on resistance of the first switch MOSFET to a value proportional to the resistance of the first reference resistor,
  (3) a second switch control circuit including
    i. a second CMOS logic circuit, having an output coupled to a gate of the second switch MOSFET, and
    ii. a second bridge circuit including a second reference resistor and a second control MOSFET, and a second operational amplifier having an output connected to a gate of the second control MOSFET and also coupled by the second CMOS logic circuit to a gate of the second switch MOSFET and operative to equalize the resistances of the second control MOSFET and the second reference resistor so as to adjust the on resistance of the second switch MOSFET to a value proportional to the resistance of the second reference resistor; and (c) wherein the on resistance of each of the first and second switch MOSFETs is equal to $R_{ONi}$, and the resistance 2R' is equal to $2R-R_{ONi}$.

13. The circuit of claim 12 wherein the resistance of the first reference resistor is substantially different from the resistance of the second reference resistor.

14. The circuit of claim 12 wherein the first and second CMOS logic circuits are CMOS inverters.

15. The circuit of claim 12 wherein the first bridge circuit includes a first bridge input conductor coupled to energize the first bridge circuit, and the second bridge circuit includes a second bridge input conductor coupled to energize the second bridge circuit.

16. The circuit of claim 15 wherein the first bridge input conductor is coupled to the first reference resistor and a (−) input of the first operational amplifier by a first current source element and is also coupled to the first control MOSFET and a (+) input of the first operational amplifier by a second current source element, and wherein the second bridge input conductor is coupled to the second reference resistor and a (−) input of the second operational amplifier by a third current source element, and is also coupled to the second control MOSFET and a (+) input of the second operational amplifier by a fourth current source element.

17. The circuit of claim 16 wherein the first, second, third and fourth current source elements are first, second, third, and fourth resistors, respectively, and wherein the first bridge input conductor conducts a voltage which is bootstrapped a constant amount from the low reference voltage, and the second bridge input conductor conducts a voltage which is bootstrapped another constant amount from the high reference voltage.

18. The circuit of claim 16 wherein the (+) input of the first operational amplifier is coupled to a drain of the first control MOSFET by a first level shift resistor, and the first reference resistor is an integral part of a first composite resistor that also includes a first level shift resistance equal to the resistance of the first level shift resistor in series with the resistance of the first reference resistor, and where the (+) input of the second operational amplifier is coupled to a drain of the second control MOSFET by a second level shift resistor, and the second reference resistor is an integral part of a second composite resistor that also includes a second level shift resistance in series with the resistance of the second level shift resistor.

19. The circuit of claim 16 wherein the resistance of the first reference resistor is scaled to a substantially larger value than the resistance of the second reference resistor, to substantially reduce a bias current flowing through the first bridge circuit relative to a corresponding bias current flowing through the second bridge circuit.

20. The circuit of claim 12 including first means in the first bridge control circuit for maintaining a first bias current energizing the first bridge circuit at a value independent of the low reference voltage and second means in the second bridge control circuit for maintaining a second bias current energizing the second bridge circuit at a value independent of the high reference voltage.

21. The digital-to-analog converter of claim 12 wherein the first and second reference resistors have the same temperature coefficient as the on resistances of the first and second control MOSFETs and the first and second switch MOSFETs.

22. The digital-to-analog converter of claim 21 wherein the resistance R is a single value, and some of the resistance values 2R' are different than others, and some of on resistance values $R_{ONi}$ are different than others.

23. The digital-to-analog converter of claim 22 including a plurality of first switch MOSFETs and second switch MOSFETs all having the same channel length, to reduce code-dependent variations in the accuracy of the digital-to-analog converter.

24. A resistive divider network adapted for use in a digital-to-analog converter, comprising:

(a) a plurality of series resistors each having a resistance R and a plurality of shunt resistors each having a resistance 2R', the digital-to-analog converter including a circuit for switching the shunt resistor of the resistive divider network to either of first and second reference voltages, the switching circuit including a first switch MOSFET coupling the low reference voltage to the leg, and a second switch MOSFET coupling the leg to the high reference voltage; and (b) wherein the on resistance of each of the first and second switch MOSFETs is equal to $R_{ONi}$, and the resistance 2R' is equal to $2R-R_{ONi}$.

25. The resistive divider network of claim 24 including switching circuitry including a first circuit including a first reference resistor and a first control MOSFET both coupled to the low reference voltage, and a first operational amplifier having an output coupled to a gate of the first switch MOSFET and operative to adjust the on resistance of the first switch MOSFET to be proportional to the resistance of the first reference resistor, and a second circuit including a second reference resistor and a second control MOSFET, and a second operational amplifier having an output coupled to a gate of the second switch MOSFET and operative to adjust the on resistance of the second switch MOSFET to be proportional to the resistance of the second reference resistor.

26. A method of providing a high degree of accuracy in a digital-to-analog converter without binary scaling of bit switches to connect shunt resistors of a resistive ladder network to either a low reference voltage or a high reference voltage, comprising:

(a) for each shunt resistor, providing a first switch MOSFET coupled between a terminal of the shunt resistor and the low reference voltage and providing a second switch MOSFET coupled between the terminal of the shunt resistor and the high reference voltage; and (b) applying control voltages to the gate electrodes of the first and second switch MOSFETs according to states of bits of a digital input word applied to the digital-to-analog converter to turn on one or the other of the first and second switch MOSFETs coupled to the terminal of each shunt resistor, respectively, so as to cause an on resistance of each turned on first or second switch MOSFET to be equal to 2R−2R', where R is the resistance of each of a plurality of series resistors of the resistive ladder network and 2R' is the resistance of the shunt resistor to which the turned on first or second switch is coupled.

27. The method of claim 26 wherein the on resistance of the first switch MOSFETs and the second switch MOSFETs are not binarily scaled.

28. The method of claim 26 wherein step (b) includes controlling the magnitudes of the control voltages such that the temperature coefficients of the on resistances of the turned on first and second switch MOSFETs are equal to a temperature coefficient of resistors of which the resistive ladder network is composed.

* * * * *